(12) United States Patent
Nordin et al.

(10) Patent No.: US 9,418,256 B2
(45) Date of Patent: Aug. 16, 2016

(54) RFID SYSTEM

(71) Applicant: Panduit Corp., Tinley Park, IL (US)

(72) Inventors: Ronald A. Nordin, Naperville, IL (US); Masud Bolouri-Saransar, Orland Park, IL (US); Mark A. Vogel, Mokena, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 14/096,530

(22) Filed: Dec. 4, 2013

(65) Prior Publication Data

US 2014/0091138 A1 Apr. 3, 2014

Related U.S. Application Data

(63) Continuation-in-part of application No. 13/276,505, filed on Oct. 19, 2011, now Pat. No. 8,816,857.

(60) Provisional application No. 61/394,924, filed on Oct. 20, 2010.

(51) Int. Cl.
*G06K 19/06* (2006.01)
*G06K 7/10* (2006.01)
(Continued)

(52) U.S. Cl.
CPC .......... *G06K 7/10009* (2013.01); *G06K 7/0008* (2013.01); *G06K 7/10168* (2013.01); *G06K 19/07749* (2013.01); *G06K 19/07771* (2013.01); *H01Q 1/007* (2013.01); *H01Q 1/2216* (2013.01); *H01Q 1/36* (2013.01); *H01Q 3/24* (2013.01); *H01Q 7/06* (2013.01); *H01Q 9/065* (2013.01); *H01Q 21/08* (2013.01); *G06K 2017/0051* (2013.01)

(58) Field of Classification Search
CPC .......... G06K 7/10009; G06K 7/10008; G06K 7/10168; G06K 19/07749; G06K 19/07771; H01Q 7/06; H01Q 1/007
USPC .................................................. 235/487, 492
See application file for complete search history.

(56) References Cited

U.S. PATENT DOCUMENTS

| | | |
|---|---|---|
| 3,713,148 A | 1/1973 | Cardullo et al. |
| 4,656,463 A | 4/1987 | Anders et al. |

(Continued)

FOREIGN PATENT DOCUMENTS

| | | |
|---|---|---|
| CA | 2279176 A1 | 7/1998 |
| DE | 10244304 B3 | 3/2004 |

(Continued)

*Primary Examiner* — Paultep Savusdiphol
(74) *Attorney, Agent, or Firm* — Christopher S. Clancy; James H. Williams; Christopher K. Marlow

(57) ABSTRACT

The present invention provides an automated system for asset tracking and management and utilizes near field Radio Frequency IDentification (RFID) technology. RFID tags are attached to the assets via a flexible mounting system, and RFID antennas (and corresponding readers) are strategically located in close proximity to read the tags. As applied to a rack or cabinet, near-field antennas are mounted along one of the mounting posts at each rack unit location such that when a piece of equipment (rack mounted or rail mounted) is installed at a particular rack unit space, the tag will be read and registered in an RFID management system. A magnetic field shaping arrangement ensures that crosstalk between adjacent rack positions is prevented. Ferrite elements are used to control the magnetic field.

6 Claims, 20 Drawing Sheets

(51) Int. Cl.
  *G06K 7/00* (2006.01)
  *G06K 19/077* (2006.01)
  *H01Q 1/00* (2006.01)
  *H01Q 1/22* (2006.01)
  *H01Q 1/36* (2006.01)
  *H01Q 3/24* (2006.01)
  *H01Q 7/06* (2006.01)
  *H01Q 9/06* (2006.01)
  *H01Q 21/08* (2006.01)
  *G06K 17/00* (2006.01)

(56) References Cited

U.S. PATENT DOCUMENTS

| | | | |
|---|---|---|---|
| 4,673,831 A | 6/1987 | Reppen | |
| 5,339,074 A | 8/1994 | Shindley et al. | |
| 5,548,816 A | 8/1996 | DeVaney | |
| 5,949,335 A | 9/1999 | Maynard | |
| 5,963,134 A | 10/1999 | Bowers et al. | |
| 5,973,598 A | 10/1999 | Beigel | |
| 6,002,331 A | 12/1999 | Laor | |
| 6,185,566 B1 | 2/2001 | Adams et al. | |
| 6,307,517 B1* | 10/2001 | Lee | 343/741 |
| 6,335,686 B1* | 1/2002 | Goff et al. | 340/572.4 |
| 6,340,932 B1 | 1/2002 | Rodgers et al. | |
| 6,351,215 B2 | 2/2002 | Rodgers et al. | |
| 6,362,737 B1 | 3/2002 | Rodgers et al. | |
| 6,367,701 B1 | 4/2002 | Fries | |
| 6,371,380 B1* | 4/2002 | Tanimura | 235/492 |
| 6,377,176 B1 | 4/2002 | Lee | |
| 6,552,661 B1 | 4/2003 | Lastinger et al. | |
| 6,621,410 B1 | 9/2003 | Lastinger et al. | |
| 6,784,802 B1 | 8/2004 | Stanescu | |
| 6,796,506 B1* | 9/2004 | Pradhan et al. | 235/462.13 |
| 6,810,353 B2 | 10/2004 | Schiffbauer | |
| 6,831,562 B2 | 12/2004 | Rodgers et al. | |
| 6,891,469 B2 | 5/2005 | Engellenner | |
| 6,968,994 B1 | 11/2005 | Ashwood Smith | |
| 6,982,646 B2 | 1/2006 | Rodgers et al. | |
| 7,030,731 B2 | 4/2006 | Lastinger et al. | |
| 7,049,933 B1 | 5/2006 | Koerner | |
| 7,059,518 B2 | 6/2006 | Forster | |
| 7,071,825 B2 | 7/2006 | VoBa | |
| 7,170,393 B2 | 1/2007 | Martin | |
| 7,246,746 B2 | 7/2007 | McNamara et al. | |
| 7,253,729 B2 | 8/2007 | Lastinger et al. | |
| 7,315,248 B2* | 1/2008 | Egbert | 340/572.7 |
| 7,350,715 B2* | 4/2008 | Pradhan et al. | 235/492 |
| 7,356,495 B2 | 4/2008 | Beigl et al. | |
| 7,374,101 B2 | 5/2008 | Kaneko | |
| 7,410,096 B2 | 8/2008 | Ozer | |
| 7,436,303 B2* | 10/2008 | Tourrilhes et al. | 340/572.1 |
| 7,446,729 B2 | 11/2008 | Maruyama | |
| 7,471,203 B2 | 12/2008 | Worthy et al. | |
| 7,486,189 B2 | 2/2009 | Koerner et al. | |
| 7,545,328 B2 | 6/2009 | Son et al. | |
| 7,557,757 B2 | 7/2009 | Deavours et al. | |
| 7,605,707 B2 | 10/2009 | German et al. | |
| 7,633,378 B2 | 12/2009 | Rodgers et al. | |
| 7,696,881 B2 | 4/2010 | Koerner et al. | |
| 7,733,273 B2 | 6/2010 | Choi et al. | |
| 8,231,062 B1* | 7/2012 | Ayyagari et al. | 235/492 |
| 2002/0011932 A1 | 1/2002 | Rodgers et al. | |
| 2002/0033757 A1 | 3/2002 | Rodgers et al. | |
| 2003/0046339 A1 | 3/2003 | Ip | |
| 2004/0138786 A1 | 7/2004 | Blackett et al. | |
| 2004/0144842 A1* | 7/2004 | Brignone et al. | 235/385 |
| 2004/0164864 A1 | 8/2004 | Chung et al. | |
| 2005/0215119 A1 | 9/2005 | Kaneko | |
| 2006/0067209 A1 | 3/2006 | Sheehan et al. | |
| 2006/0148279 A1 | 7/2006 | German et al. | |
| 2006/0171538 A1* | 8/2006 | Larson et al. | 380/270 |
| 2006/0261951 A1 | 11/2006 | Koerner et al. | |
| 2007/0043476 A1 | 2/2007 | Richards et al. | |
| 2007/0050271 A1 | 3/2007 | Ufford et al. | |
| 2007/0057259 A1 | 3/2007 | Nagumo | |
| 2007/0090957 A1* | 4/2007 | Kozlovski | 340/572.7 |
| 2007/0139285 A1* | 6/2007 | Maruyama et al. | 343/741 |
| 2007/0205894 A1* | 9/2007 | Nelson et al. | 340/572.1 |
| 2007/0211689 A1 | 9/2007 | Campero et al. | |
| 2007/0221730 A1 | 9/2007 | McReynolds et al. | |
| 2008/0107274 A1 | 5/2008 | Worthy | |
| 2008/0180249 A1 | 7/2008 | Butler et al. | |
| 2008/0265722 A1 | 10/2008 | Saliaris | |
| 2009/0015383 A1 | 1/2009 | Stewart | |
| 2009/0096581 A1 | 4/2009 | Macauley et al. | |
| 2009/0108995 A1* | 4/2009 | Tucker et al. | 340/10.1 |
| 2009/0109031 A1 | 4/2009 | Calvin et al. | |
| 2009/0115580 A1 | 5/2009 | Koerner et al. | |
| 2009/0115613 A1 | 5/2009 | Piazza et al. | |
| 2009/0189767 A1* | 7/2009 | Primm et al. | 340/572.1 |
| 2009/0207022 A1* | 8/2009 | Reckeweg et al. | 340/572.1 |
| 2010/0109892 A1 | 5/2010 | Fariello et al. | |
| 2011/0089634 A1* | 4/2011 | Thorson et al. | 273/238 |

FOREIGN PATENT DOCUMENTS

| | | |
|---|---|---|
| EP | 1284400 A1 | 2/2003 |
| EP | 1837809 A1 | 9/2007 |
| EP | 1607876 B1 | 6/2009 |
| JP | 2005-184078 A | 7/2005 |
| JP | 2006-092385 A | 4/2006 |
| JP | 2006-236274 A | 9/2006 |
| JP | 2006-324821 A | 11/2006 |
| WO | 0182009 A2 | 11/2001 |
| WO | 0210040 A1 | 2/2002 |
| WO | 2006063023 A1 | 6/2006 |
| WO | 2009105505 A2 | 8/2009 |

* cited by examiner

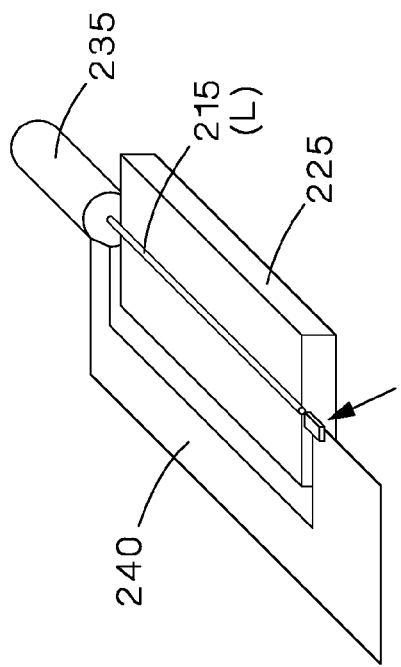
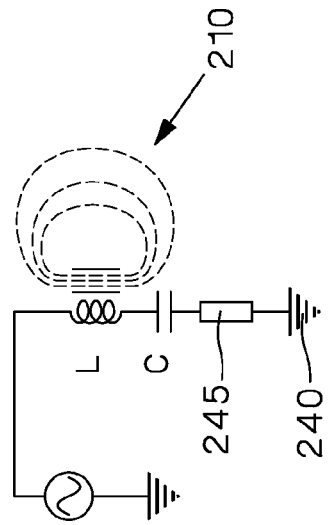
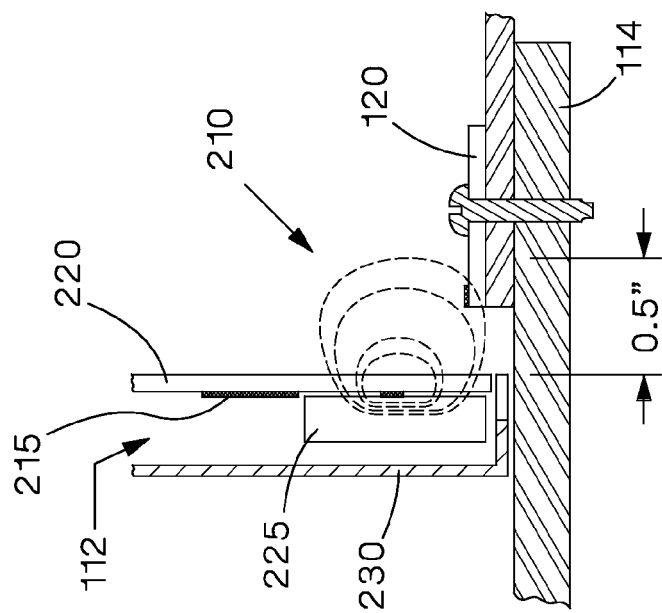
FIG. 2b
FIG. 2c
FIG. 2a

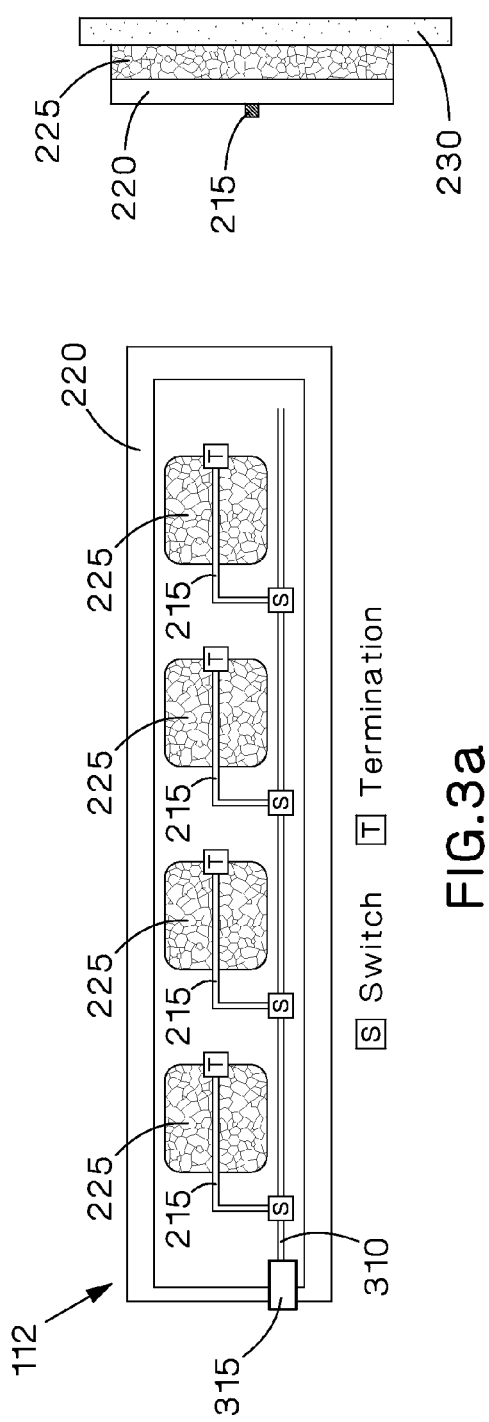
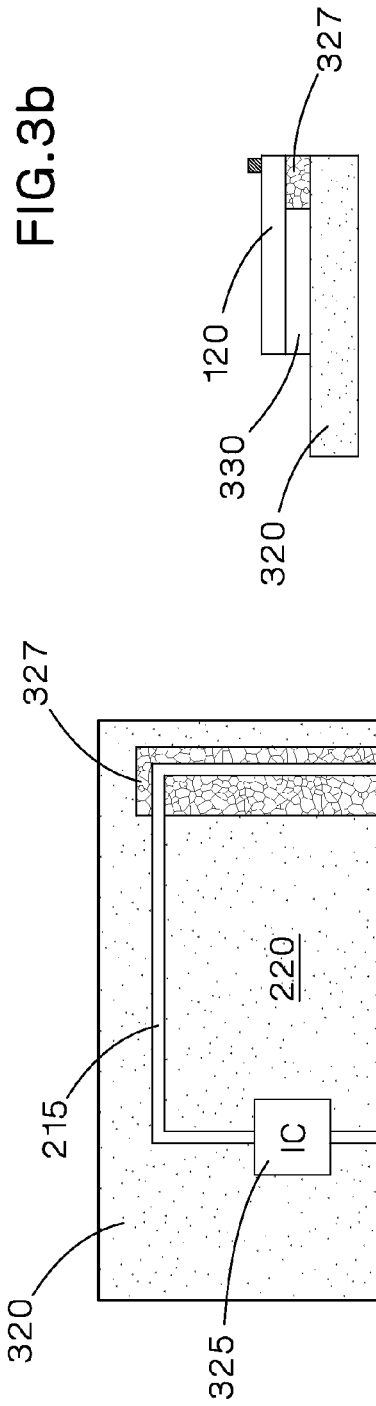

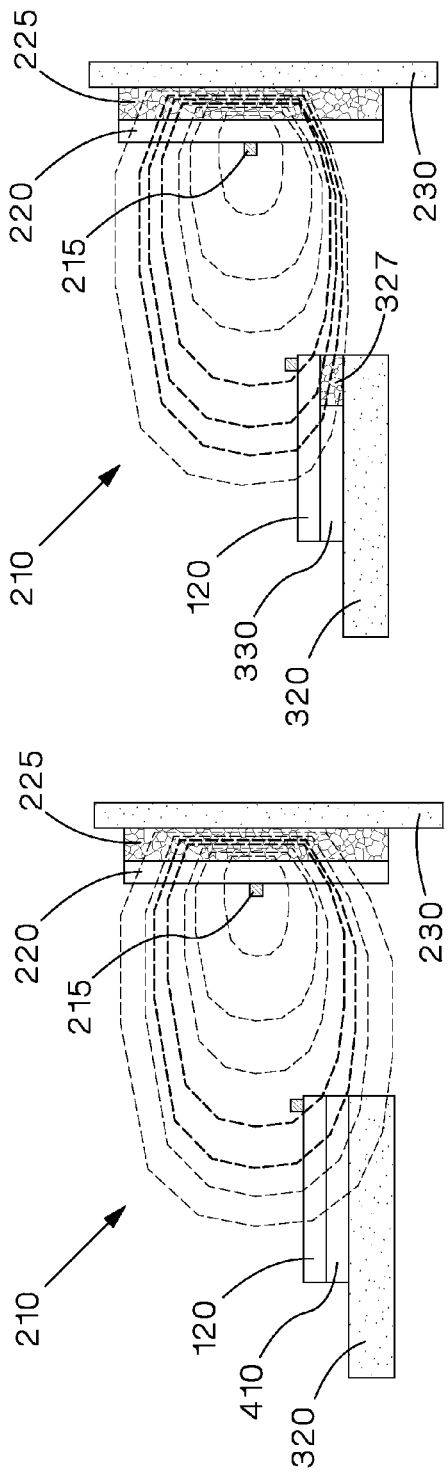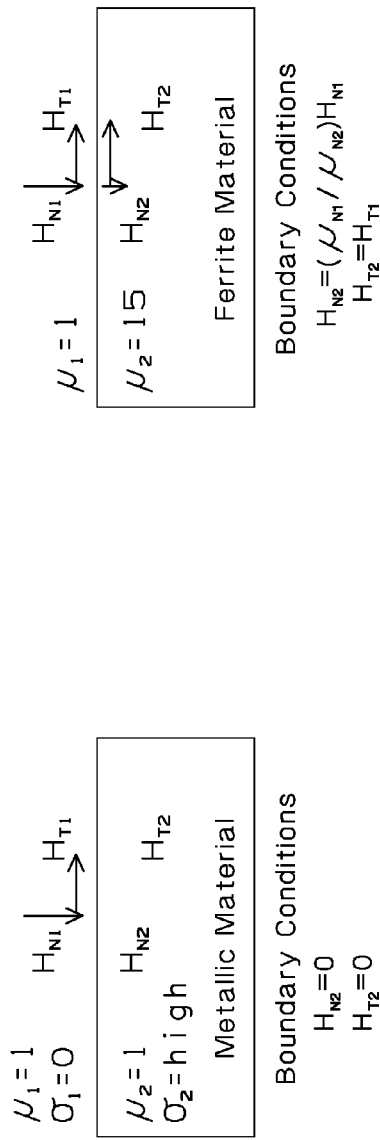
FIG.4c
FIG.4d
FIG.4a
FIG.4b

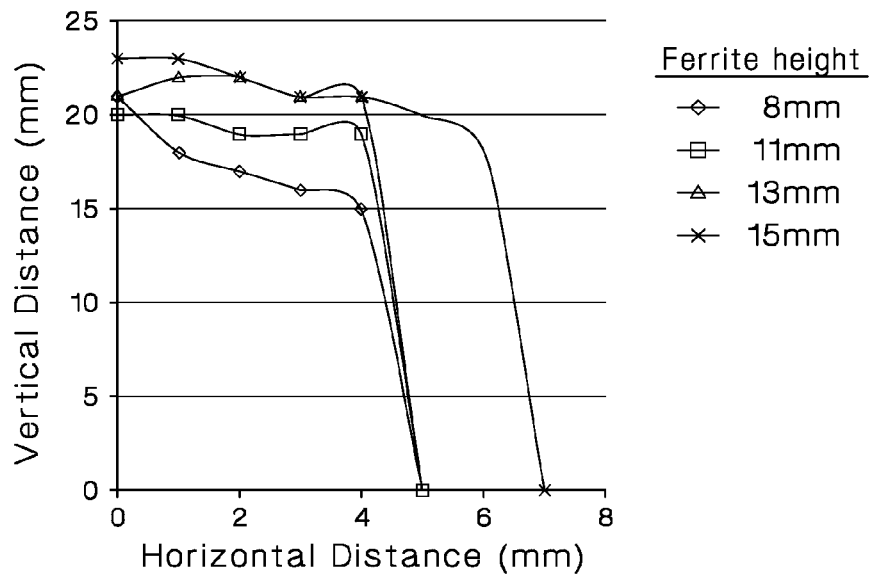
FIG.5a
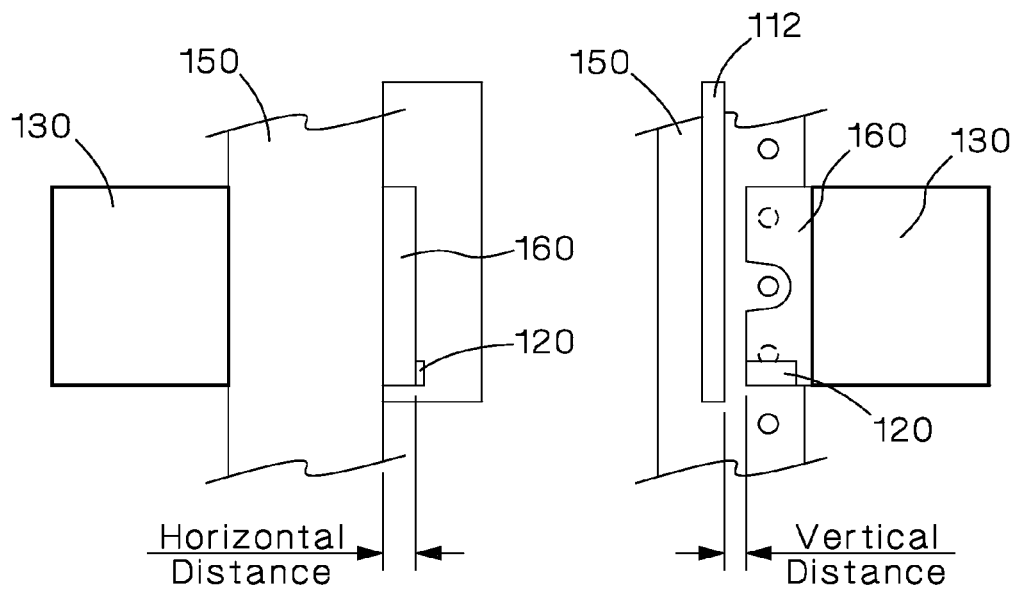
Side View
FIG.5b
Front View
FIG.5c

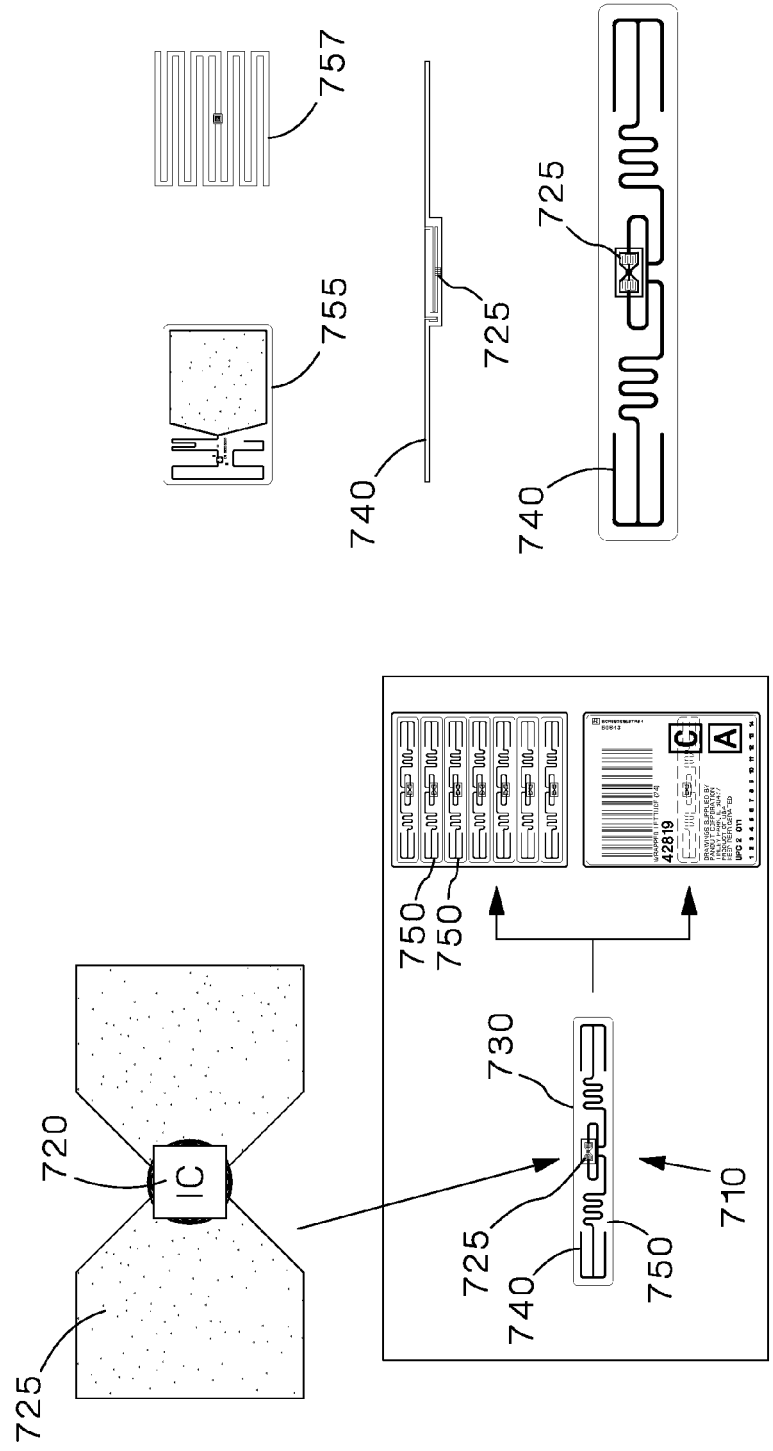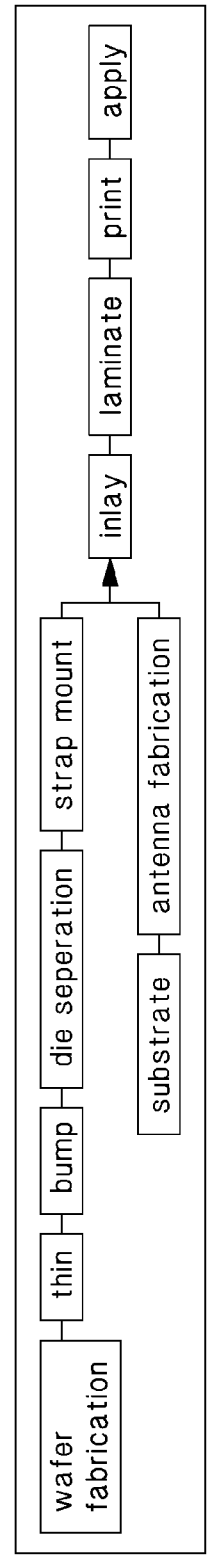
FIG. 7

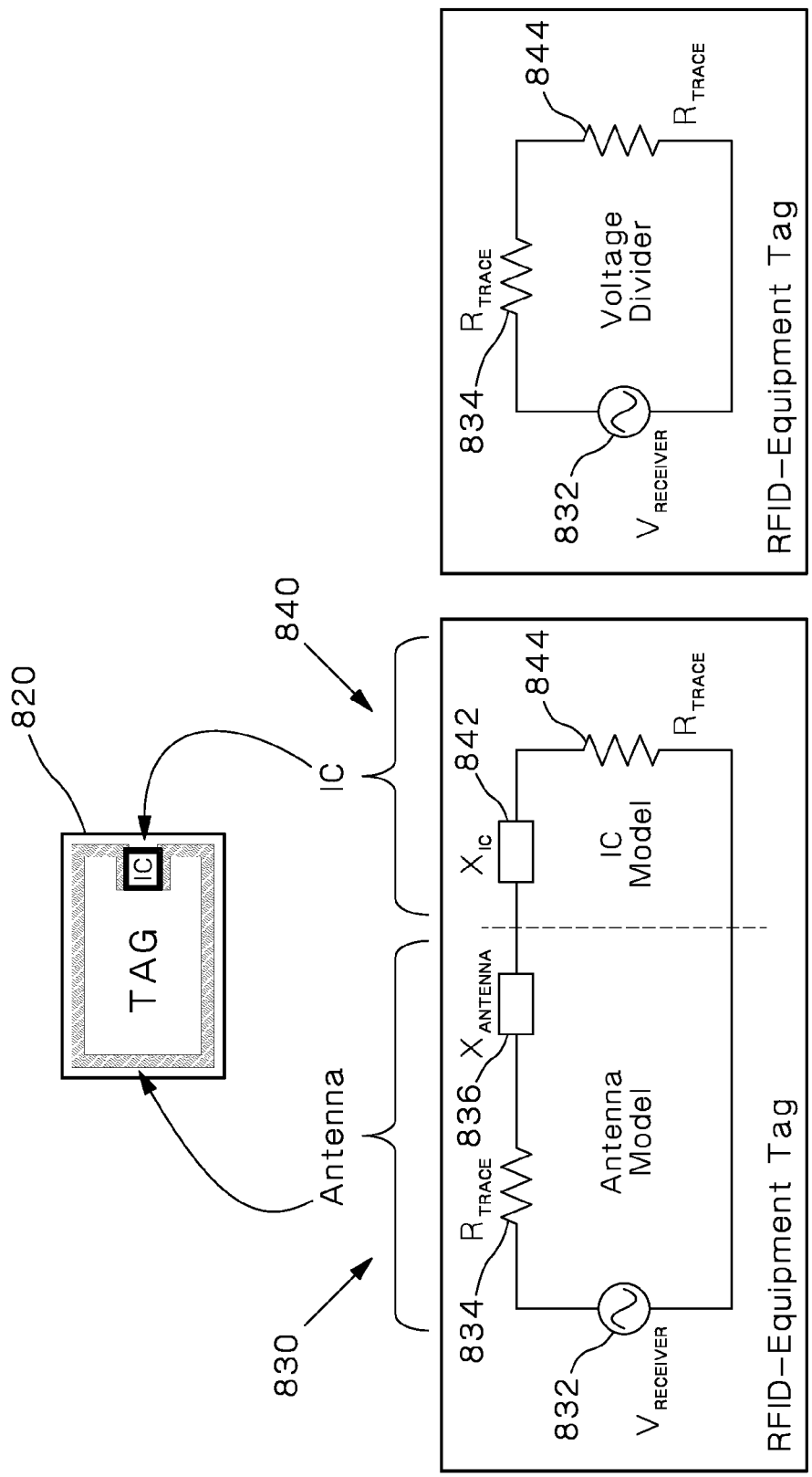

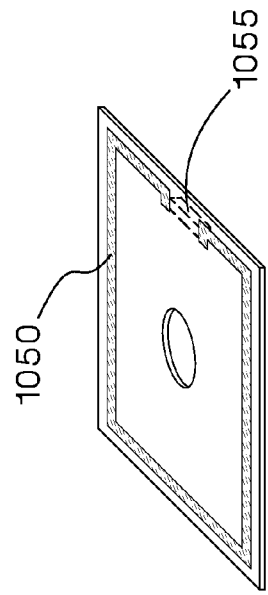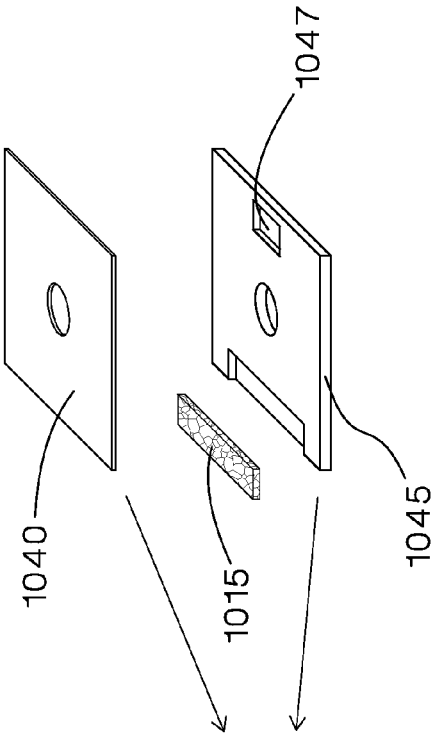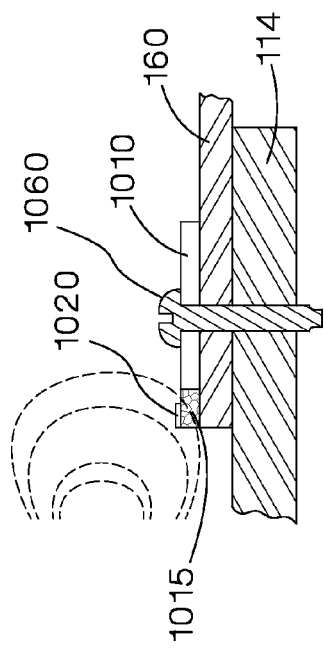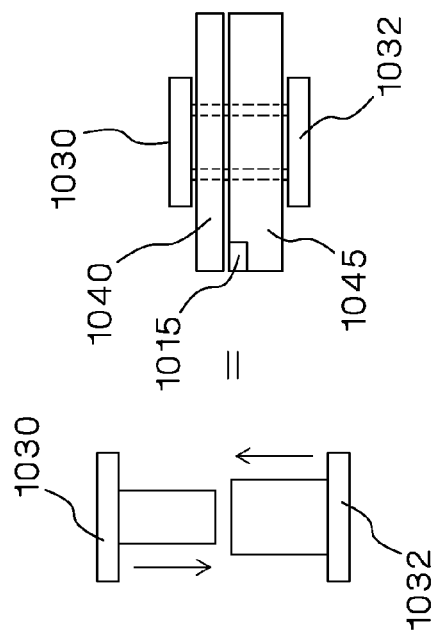
FIG.10b
FIG.10d
FIG.10a
FIG.10c

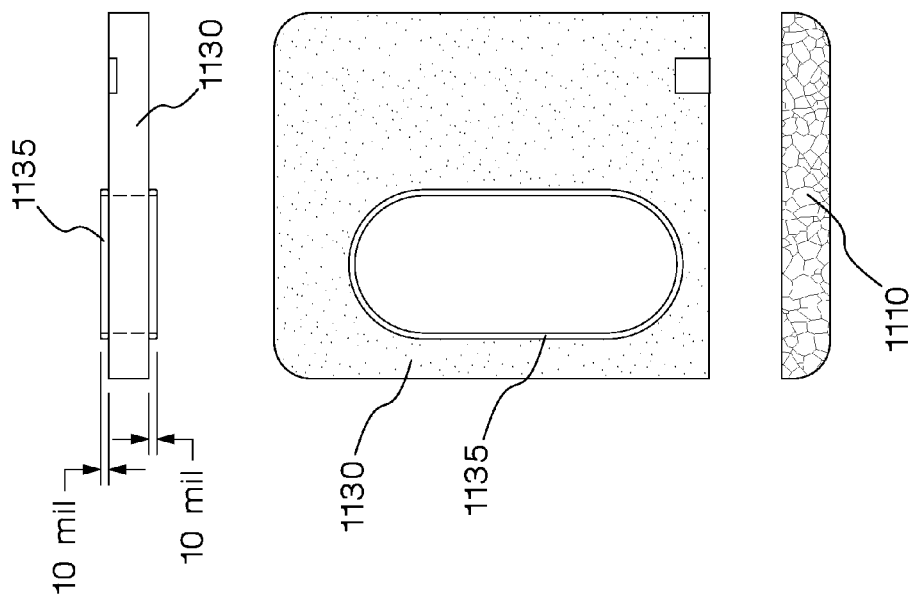
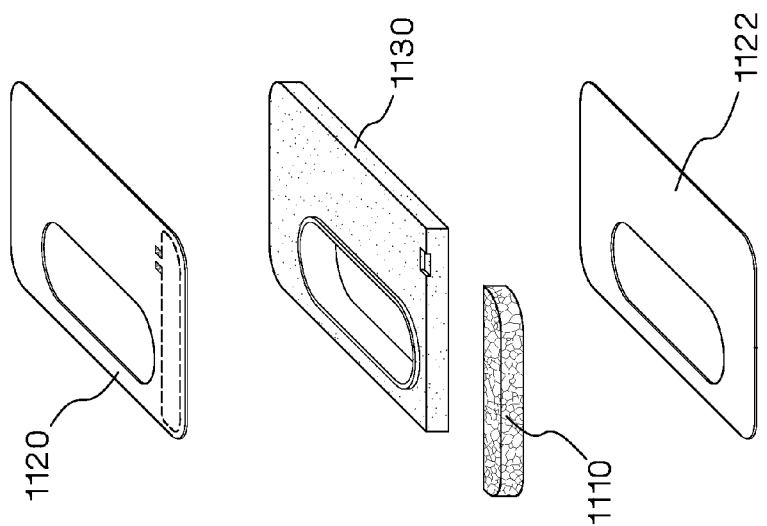
FIG. 11b
FIG. 11a

RFID SYSTEM

CROSS-REFERENCE TO RELATED APPLICATION

This application is a continuation-in-part of U.S. patent application Ser. No. 13/276,505, filed Oct. 19, 2011; which in turn claims priority to U.S. Provisional Application Ser. No. 61/394,924, filed Oct. 20, 2010, the subject matter of which is hereby incorporated by reference in its entirety.

BACKGROUND

This invention relates generally to asset tracking systems, and more particularly to Radio Frequency IDentification (RFID) systems that employ ferrite material to shape the magnetic field pattern of an antenna-like source or detector Asset tracking within Data Centers is important for the assistance in inventory audits, physical location identification of assets that require repair or de-commissioning, and for rack environmental management. The industry currently addresses this problem largely by the implementation of manual techniques (handwritten or Excel® spreadsheet-based physical location of assets). Some data center managers have improved upon these techniques by incorporating bar-code systems into their asset tracking methods. Nevertheless, the bar code methods are manually implemented, and therefore have cost and accuracy issues, notwithstanding that they are certainly better than processes that are completely manual.

There is, therefore, a need in the IT data center market for a system that tracks assets automatically. There are a number of solutions that are emerging to satisfy this particular need (e.g., solutions that rely on wireless, GPS, image processing, and/or far field RFID). Another method or technology for automatic asset tracking utilizes near field RFID technology and can resolve where a particular asset is located down to the rack unit level within a rack or cabinet.

RFID technology offers the following benefits over manual techniques: 1) an automated method of asset tracking and reporting; 2) a lower life cycle cost; 3) numerous different types of rack IT assets that can be tracked (e.g., patch panels, blanking panels, absence of equipment); 4) greater accuracy for asset rack unit location with accurate asset attributes; and 5) automated monitoring of rack inventory for accurate environmental management Important attributes for near-field RFID methods to gain wide acceptance in the market place are low cost and simple installation (in existing and new data centers).

In using a near-filed RFID system, the RFID tag usually needs to be located a specific distance with a specific orientation in relation to the antenna array for the tag reader. However, many of the items of equipment have various contoured front panels that are employed for aesthetic purposes or to provide various release mechanisms designed to facilitate the removal of the asset from the cabinet. Due to this variety of contours, there needs to be an RFID system capable of being retrofitted easily in a wide variety of enclosures and with a wide variety of equipment.

SUMMARY

In one aspect, there is provided an automated system that, when employed for asset tracking and management, utilizes near field Radio Frequency IDentification (RFID) technology. In accordance with this aspect of the invention, RFID tags are attached to assets using a flexible mounting system, and RFID antennas (and corresponding readers) are strategically located in close proximity to read the tags. To apply an RFID system to a rack or cabinet, near-field antennas are mounted along one of the mounting posts at each rack unit location such that when a piece of equipment (rack mounted or rail mounted) is installed at a particular rack unit space, the tag will be read and registered in an RFID management system.

In one aspect of the invention, there is provided a method of tracking equipment installed on a rack. The method includes attaching an RFID tag to a mounting portion of the equipment using a flexible mounting system; attaching an antenna system to the rack, the antenna system issuing a magnetic field that impinges upon the RFID tag; and shaping the magnetic field issued by the antenna system in response to a distance between the antenna system and the RFID tag.

In one embodiment of this aspect, the step of attaching an antenna system to the rack is performed on a mounting post of the rack. In one embodiment of this aspect, the step of attaching an RFID tag is performed on a mounting ear of the equipment in close proximity of the mounting post of the rack.

In one aspect of the invention, there is provided a method of manufacturing a RFID tag. The method includes attaching a RFID integrated circuit to a first printed circuit board and bonding the first printed circuit board to a substrate. In one embodiment of this aspect, the first printed circuit board is a flex printed circuit board, whereby an RFID strap is formed. In some embodiments, prior to performing the step of bonding the first printed circuit board to a substrate there are provided the further steps of adhering the flex printed circuit board to an antenna flex printed circuit board, to form an inlay and adhering the inlay to a substrate.

In one aspect of the invention, there is provided a system for protecting equipment that is to be installed on a rack. The system includes a near field RFID tag installed in a mounting portion of the equipment that is to be protected. There is additionally provided an antenna array installed on the rack in predetermined relation to the near field RFID tag for issuing a magnetic field. In one embodiment of this aspect, there is further provided a magnetic field shaping arrangement for controlling the magnetic field issued by the antenna array. The magnetic field shaping arrangement includes, in some embodiments, a ferrite element installed on the near field RFID tag. In one embodiment, the magnetic field shaping arrangement is provided with a ferrite member installed in the vicinity of the antenna array distal from the near field RFID tag.

The scope of the present invention is defined solely by the appended claims and is not affected by the statements within this summary.

BRIEF DESCRIPTION OF THE DRAWINGS

The invention can be better understood with reference to the following drawings and description. The components in the figures are not necessarily to scale, emphasis instead being placed upon illustrating the principles of the invention.

FIGS. 2a to 2c depict simplified schematic and isometric representations that are useful in describing a near field magnetic coupling technique that is used to communicate between an antenna array and an IT equipment tag, in accordance with the invention;

FIGS. 3a to 3d depict plan and side view simplified representations useful to describe a construction that utilizes ferrite material for magnetic field shaping of an antenna array module and an IT equipment tag for a rack-unit-based near field RFID system, in accordance with the invention;

FIGS. 4a to 4d depict simplified schematic representations of magnet field lines between an antenna array and an IT equipment tag for the embodiments with and without a ferrite material within the IT equipment tag;

FIGS. 5a to 5c depict graphical and simplified isometric representations that are useful to illustrate the RFID system sensitivity as a function of physical proximity between a printed circuit board (PCB) antenna and the IT equipment tag;

FIG. 7 depicts a simplified representation that is useful to illustrate the components of a specific illustrative embodiment of the invention of far field IT equipment RFID tags, as well as an illustrative manufacturing technique;

FIGS. 8a and 8b depict an IT equipment tag that consists of two sections, and the optimization of the circuit to achieve maximum power transfer from the source into the IC load;

FIGS. 10a to 10d depict a specific illustrative embodiment of an IT equipment RFID tag in which ferrite is used to enhance received coupled power;

FIGS. 11a and 11b depict structural representations of a further specific illustrative embodiment of an IT equipment RFID tag that employs ferrite to enhance the received coupled power.

DETAILED DESCRIPTION

Figure 1D:
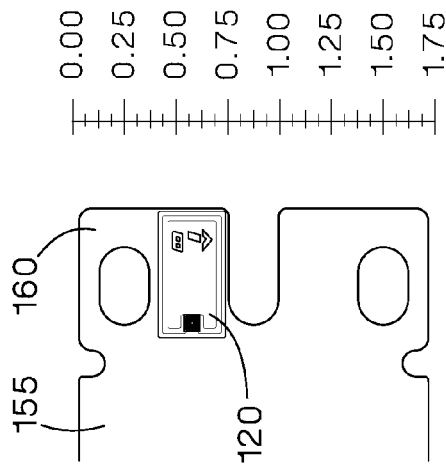
FIGS. 1a to 1d depict simplified isometric and plan representations of a specific illustrative embodiment of the invention.
Figure 1B:
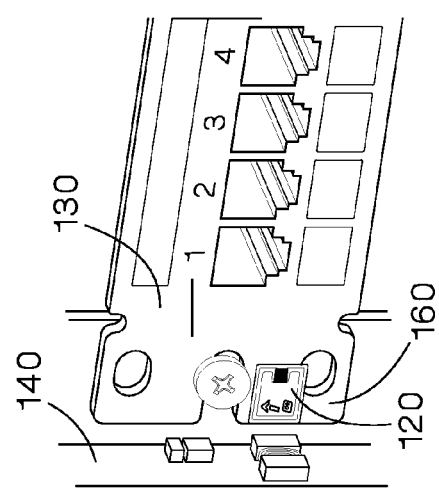
Figure 1C:
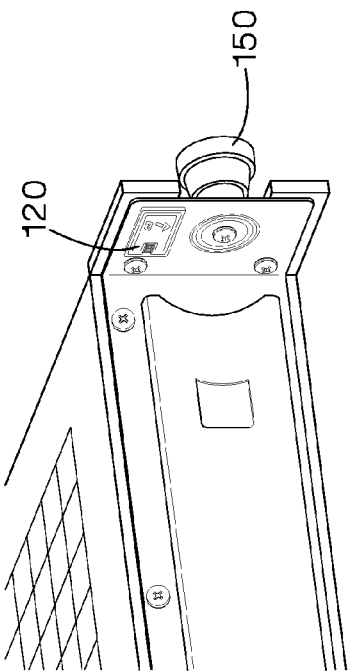
Figure 1A:
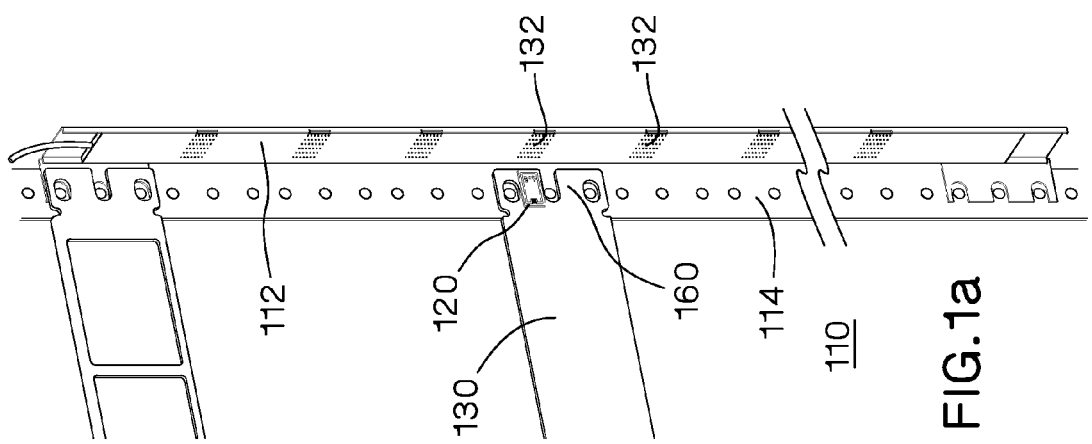

With reference to FIGS. 1a to 1d, simplified isometric and plan representations of a specific illustrative embodiment of the invention are depicted along with an illustrative asset tracking system. FIG. 1a illustrates the use of RFID at the rack unit level of granularity. More specifically, RFID tagged equipment is illustrated in use with a rack unit 110.

The technique of the present invention relies on near field magnetic coupling between an antenna array 112 mounted on the racks mounting post 114 and an RFID tag 120 that is installed on RFID tagged equipment 130. Referring to FIG. 1b, there is shown in isometric representation RFID tag 120 that is attached to IT equipment 130 that mounts in the rack. FIGS. 1a through 1d illustrate two key components of the RFID rack-unit-based asset tracking management system of the present invention, specifically antenna array 112 and RFID tag 120 attached to the IT equipment. Antenna array 112, which as stated is mounted onto the racks mounting post 114, contains one near field coupling antenna 132 (or sensor) per rack unit space. The IT equipment tags are mounted as shown on the IT equipment assets that are to be tracked. These tags can be placed on equipment that is mounted on a rail 140, as shown in FIG. 1b, or mounted on a post 150, as shown in FIG. 1c. Since the IT equipment RFID tags are typically mounted on metallic surfaces, such as surface 155 shown in FIG. 1d, the performance of a tag directly on a metallic surface will be poor unless special design considerations are applied.

Referring again to FIGS. 1a to 1d, when an equipment asset is mounted onto the rack, the previously provisioned RFID tag mounted on equipment mounting ear 160 is interrogated by a reader (not shown in this figure) via post mounted antenna array 112. The reader reports that a piece of equipment has been inserted into a particular rack at a particular rack unit level to an asset tracking management software. Conversely, when the equipment is removed from the rack, the reader also notifies the asset tracking management software (not shown). RFID tags 120 are, in some embodiments, located on the equipment's mounting ears 160 as shown in FIGS. 1a through FIG. 1d. As indicated above, these equipment tags communicate to an RFID reader via the post-mounted antennas.

Through the application of this RFID technology, assets within a data center (not shown) can be effectively and automatically tracked and managed. The RFID tags can be mounted on both active and passive equipment that is either front-post-mounted or rail-mounted. The RFID antennas can be mounted at each rack unit location in close proximity to the tagged equipment. This technique allows automatic detection of any tagged equipment that is mounted within the rack. Software can then be utilized to provide a complete and visible configuration of the rack. (Sub-equipment assets like line cards and blade servers are detectable using extensions of the present RFID system. Alternatively, such sub-equipment assets are detectable with the use of equipment chassis network interfaces, such as Integrated Product Lifecycle Management (IPLM) systems.

The RFID tags discussed above for automatic rack unit detection utilize near-field coupling to establish the detection and communication between a reader and an equipment tag. The definition of electromagnetic near-field and far-field modes of operation is generally related to the distance between the source antenna and the measuring point or region. The near field region is typically within a radius much less than its wavelength r<<λ, while the far field region is typically outside a radius much greater than its wavelength r>>λ. Since the most common RFID high-frequency signal transmits at about 900 MHz in free space, the wavelength is about 33.3 cm (13.1 in). For this frequency range, the regions are defined as follows: Near Field, r<1-2 in. and far field, r>5-10 ft. It is to be noted that it is a misnomer to use the phrase "near-field antenna," as this falsely implies that an electromagnetic wave is launched. In reality, this mechanism is preferably described as a magnetic coupling method.

Characterization of the magnetic field shape that the antenna emits and the preferred magnetic field shapes that the tag is optimized to are important to the overall performance of the system.

FIG. 2 is useful to depict the near field magnetic coupling technique that is used in the practice of the invention to communicate between the antenna array and the IT equipment tag. Elements of structure that have previously been discussed are similarly designated. As shown in FIG. 2a, magnetic field 210 is generated by a current (not shown) on a trace 215 on PCB 220 of antenna array 112 that couples with the IT equipment tag's antenna. It is to be noted that the shape of the magnetic field pattern is dependent upon various parameters, illustratively including the dimensions and permeability of a ferrite 225 that is placed behind the current-carrying trace. The length, width, and height of the current carrying trace 215 on the PCB, and any metallic surfaces behind the ferrite, such as metal enclosure 230, or on the PCB in front of the current carrying trace, will influence the shape and intensity of the magnetic field.

The antenna formed by the current carrying trace on the PCB is implemented as shown in FIG. 2b. As shown in FIG. 2b, trace 215 is juxtaposed to ferrite 225 and connected to a PCB transmission line 235. A ground plane 240 is schematically represented in FIG. 2b.

An electrical equivalent model of this antenna is shown in FIG. 2c. It is important in the practice of the invention that the antennas within the antenna array communicate robustly with their associated rack unit IT equipment tags and not with neighboring rack unit IT equipment tags. Hence the shape of the magnetic field generated by each antenna must be properly designed. It is seen from this figure that the equivalent circuit consists of an inductance L and a capacitance C arranged in series with one another and with an impedance matching element 245. These electrical parameters are represented in FIG. 2b.

FIGS. 3 and 4 illustrate the proposed construction that employs the use of ferrite material to enhance the coupling between the PCB antenna array and the IT equipment tag. FIGS. 3a to 3d also depict schematically an IT equipment tag 120 for a rack-unit-based near field RFID system, constructed in accordance with the invention.

More specifically, FIGS. 3a to 3d are plan and side view simplified representations useful to describe a construction that utilizes ferrite material 225 for magnetic field shaping of an antenna array module 112. Elements of structure that have previously been discussed are similarly designated. More specifically, FIGS. 3a to 3d depict a preferred illustrative construction that utilizes ferrite material 225 for magnetic field shaping of an antenna array module 112 and an IT equipment RFID tag 120 for a rack unit based near field RFID system. The antenna array module construction's top view is depicted in FIG. 3a and the side view is depicted in FIG. 3b.

FIG. 3a depicts plural circuit traces 215 which are coupled by respectively associated switches S to a bus 310 that is provided with a coupler 315 that is coupled to receive and transmit RF energy to an RF source (not shown).

The top view of the structure of IT equipment RFID tag 120 is depicted in FIG. 3c, and the side view is depicted in FIG. 3d. In both figures, a metal surface 320 is disposed in close proximity to traces 215 that form antenna array 112. As depicted in FIG. 3c, copper trace 215 on PCB 220 is coupled to an integrated circuit 325. In FIG. 3d, RFID tag 120 is separated from metal surface 320 by a ferrite spacer 327 and a filler spacer 330.

FIGS. 4a to 4d depict simplified schematic representations of magnet field lines 210 between an antenna array and an IT equipment tag for the embodiments with and without a ferrite spacer 327 within the IT equipment tag. Elements of structure that have previously been discussed are similarly designated. The embodiment of FIG. 4a illustrates RFID tag 120 separated from metallic surface 320 by an air spacer 410. Ferrite spacer 327 underneath RFID tag 120 helps to increase the received coupled power from the antenna array by "channeling" or "guiding" the magnetic field away from metallic surface 320. Thus, it is seen in the air spacer embodiment of FIG. 4a that magnet field lines 210 extend into metal surface 320.

The magnetic characteristics of the embodiment depicted in FIG. 4a are depicted in FIG. 4b. More specifically, such magnetic characteristics are directed to the metallic material 320. The magnetic characteristics of the embodiment depicted in FIG. 4c are depicted in FIG. 4d, and are directed to the magnetic characteristics of the ferrite spacer 327.

FIGS. 5a to 5c depict graphical and simplified isometric representations that are useful to illustrate the RFID system sensitivity as a function of physical proximity between antenna array 112 and the IT equipment RFID tag 120. Elements of structure that have previously been discussed are similarly designated. The sensitivity of the system is plotted in the graphical representation of FIG. 5a. When IT equipment RFID tag 120 is placed within the area outlined in the RFID system sensitivity graph of FIG. 5a, the system will operate correctly. If the tag is placed outside of this region, the tag may not operate satisfactorily. The iso-curves depicted in FIG. 5a are dependent on the tags' physical proximity to the antenna source as well as the overall construction of the system (e.g., the size of the ferrite core material, magnitude of transmit power from the system reader, and the shape and position of the PCB trace that forms the antenna).

Figure 6:
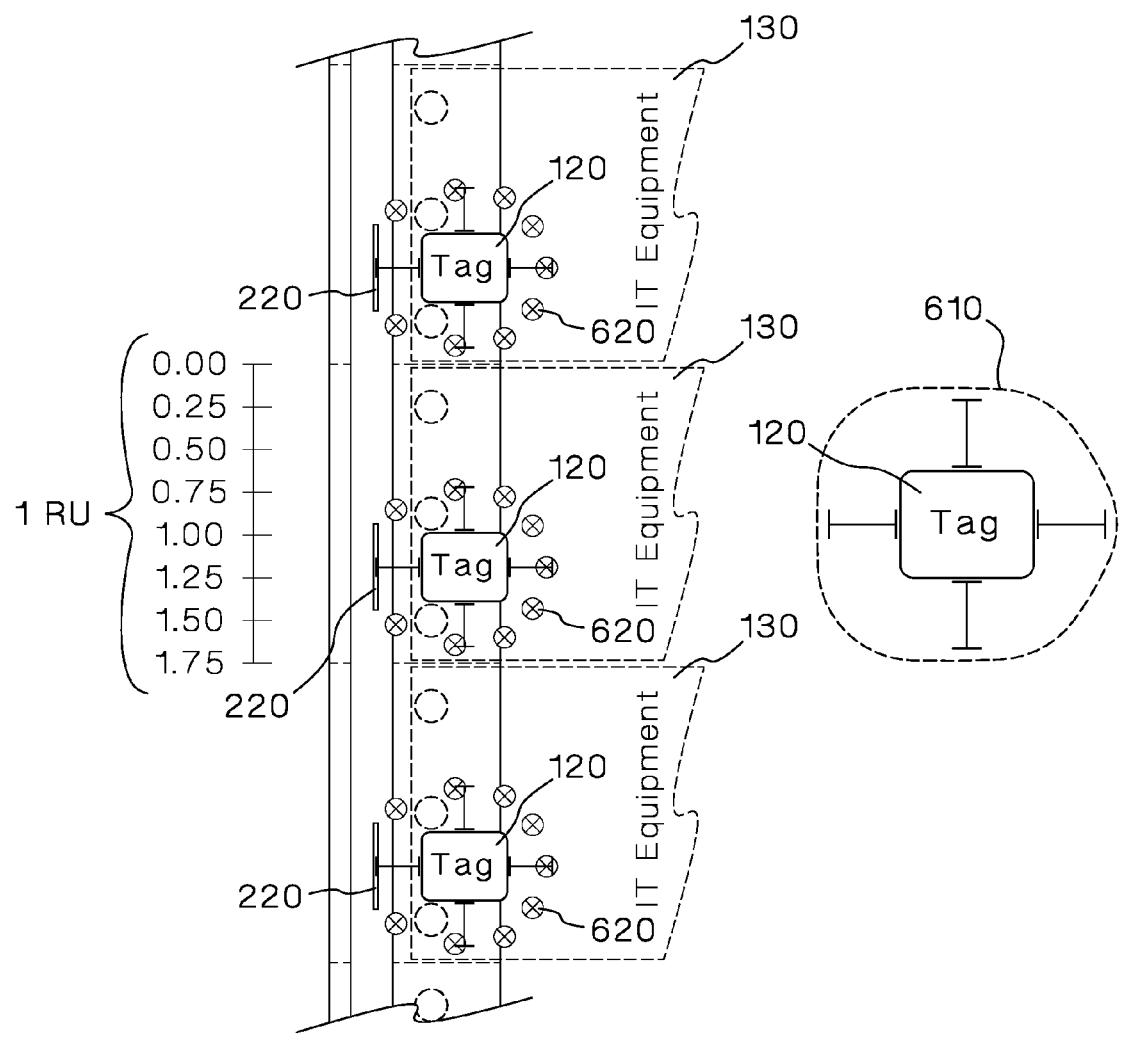
FIG. 6 depicts a simplified schematic representation of the shape of the near field magnetic field pattern.

FIG. 6 depicts a simplified schematic representation of the shape of the near field magnetic field pattern that is useful to summarize the preferred operating distances for optimal system performance. It is to be noted that the magnetic field shape is designed to provide tolerance to the actual position of the IT equipment RFID tag 120 while minimizing any crosstalk between rack unit positions. The magnetic field lines associated with respective RFID tag 120 are represented in the figure by the plural X in a circle 620. Outline 610 illustrates the safe operating region associated with RFID tag 120. This outline incorporates degrees of freedom corresponding to: PCB trace length, width, and position; ferrite core length, width, and position; proximity to metal behind the ferrite; proximity to metal in front of the PCB trace; and magnitude of the transmission power level.

FIG. 7 depicts a far field IT equipment RFID tag 710 and an illustrative manufacturing technique, according to one aspect of the invention. The depicted technique uses an RFID IC 720 soldered onto a Flex PCB assembly 725 that is designated an "RFID strap." The RFID strap is, in some embodiments, glued with electrically conductive adhesive (not shown) onto another flex PCB 730, that is termed the "antenna flex PCB." It is to be noted that an RFID IC can be soldered directly onto the antenna flex PCB, thereby obviating the need for the herein-disclosed strap process when using appropriate manufacturing process technologies. Antenna flex PCB 730 implements either a far field antenna as shown in the figure, or a near field antenna (not shown) depending upon the design of the antenna itself. The constructed assembly is termed an "inlay," represented by inlay 750. An RFID tag is formed when inlay 750 is bonded onto a substrate (not specifically designated). The inlay constitutes a key component of the RFID tag of the present invention. The manufacturing process steps are illustrated by the function bocks in this figure. Systems 755 and 757 are illustrative of products that are manufactured in accordance with the disclosed manufacturing process.

FIGS. 8a and 8b depict an IT equipment RFID tag 820 that consists of two sections, and the optimization of the circuit to achieve maximum power transfer from the source into the IC load. Referring to FIG. 8a, the IT equipment tag consists of two sections and hence is modeled in two sections, specifically a near field antenna 830 and an IC 840. Near field antenna 830 is modeled as an ideal receiver voltage source 832 with a source resistance 834 and the reactance component 836 of the antenna itself. The IC has a complex input impedance 842 that can be represented as a reactance and a resistance 844 that represents the load of the IC. In FIG. 8b, when the IT equipment tag's complex antenna impedance is matched to the complex input impedance of the IC, an optimized circuit is achieved (i.e., maximum power transfer from the source into the IC load occurs when $X_{ANT}$ and $X_{IC}$ are conjugates of each other and hence cancel). For example, if $X_{ANT}=j\omega L$ and $X_{IC}=1/j\omega C$ ($=-j/\omega C$), then when $L=1/C$ a cancellation will occur and the circuit will have been reduced to a simple voltage divider, as depicted in FIG. 8b.

Figure 9A:
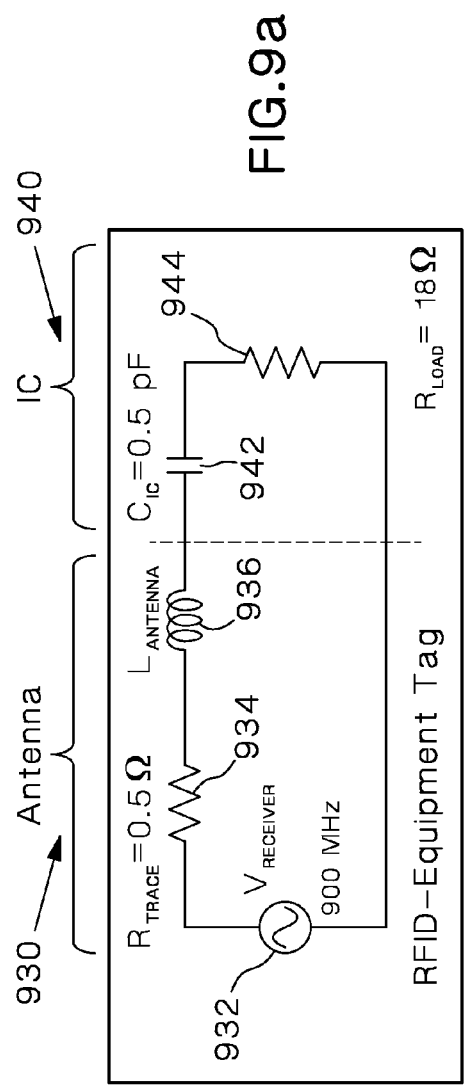
FIGS. 9a and 9b depict a specific illustrative embodiment of a tag in which the reactance of an antenna and the input impedance of an RFID IC cancel one other.
Figure 9B:
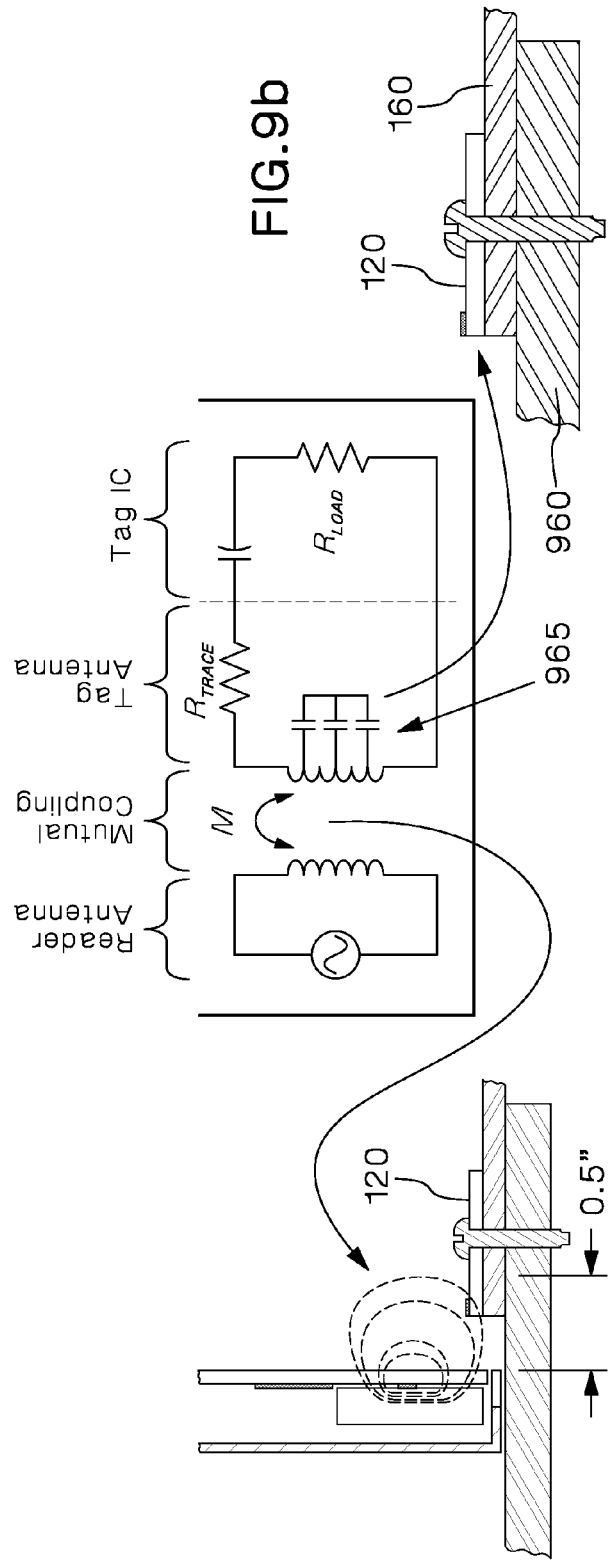

FIGS. 9a and 9b depict an illustrative embodiment of a tag wherein the reactance impedance components of the antenna and the input of the RFID IC cancel each other. Elements of structure that have previously been discussed are similarly designated. As depicted in FIG. 9a, the impedance arising from the combination of resistance 934 inductance 936 from the tag's loop antenna is designed to match (i.e., provide a complex conjugate) the RFID IC's input impedance, which is the serial combination of equivalence capacitance 942 and resistance 944, at an illustrative operating frequency of 900 MHz. As depicted in FIG. 9b, the impedance of the tag's loop antenna is influenced by the environment to which it is attached (not shown). In this figure, RFID tag 120 is installed on mounting ear 160 in the vicinity of a metallic surface 960. In the embodiment, mutual coupling M is essentially the result of mutual inductance. The components designated generally as 965 represent parasitic capacitance and inductance.

FIGS. 10a to 10d depict a specific illustrative embodiment of an IT equipment RFID tag 1010 in which ferrite is used to enhance received coupled power. A ferrite spacer 1015 is used under trace 1020 as shown in FIG. 10a to enhance the coupled power received by RFID tag 1010. As shown, RFID tag 1010 is installed on mounting ear 160 of the IT equipment (not shown in this figure), which is itself installed on mounting post 114.

The tag antenna is formed by a PCB trace 1050 that connects to a tag IC 1055 as shown in FIG. 10b. The PCB is attached (e.g., adhesive) to a plastic molded component as shown in FIG. 10d. A metallic rivet assembly having rivet portions 1030 and 1032, as shown in FIG. 10c, is inserted onto PCB-molded component assembly, which in this embodiment includes a PCB element 1040 and a molded plastic spacer element 1045. As shown, plastic spacer element 1045 in this specific illustrative embodiment of the invention is provided with a cavity 1047 that accommodates tag IC 1055.

The rivet assembly has two functions; first it allows the force from a screw 1060 to transfer to metallic IT equipment mounting ear 160 and mounting post 114, and secondly it provides an electrical path from the threaded holes in the mounting ear formed by the screw to connect to the metallic post. The function of this molded component is to capture the ferrite material, protect the RFID tag, and provide a robust way for a screw to be inserted through the module as shown in FIG. 10c.

FIGS. 11a and 11b depict structural representations of a further specific illustrative embodiment of an IT equipment RFID tag that employs ferrite 1110 to enhance the received coupled power. Ferrite 1110 is, as previously discussed, employed in the structure shown in FIG. 11a to enhance the received coupled power. The ferrite is held in place by the two outer PCBs 1120 and 1122 and metallic molded component 1130. The metallic molded component has features incorporated in to protect the RFID tag and has a raised (proud) feature 1135 that will have functionality similar to that of the rivet assembly depicted in FIG. 10. In this specific illustrative embodiment of the invention, feature 1135 has a height above the surface of approximately 10 mil.

Figure 12A:
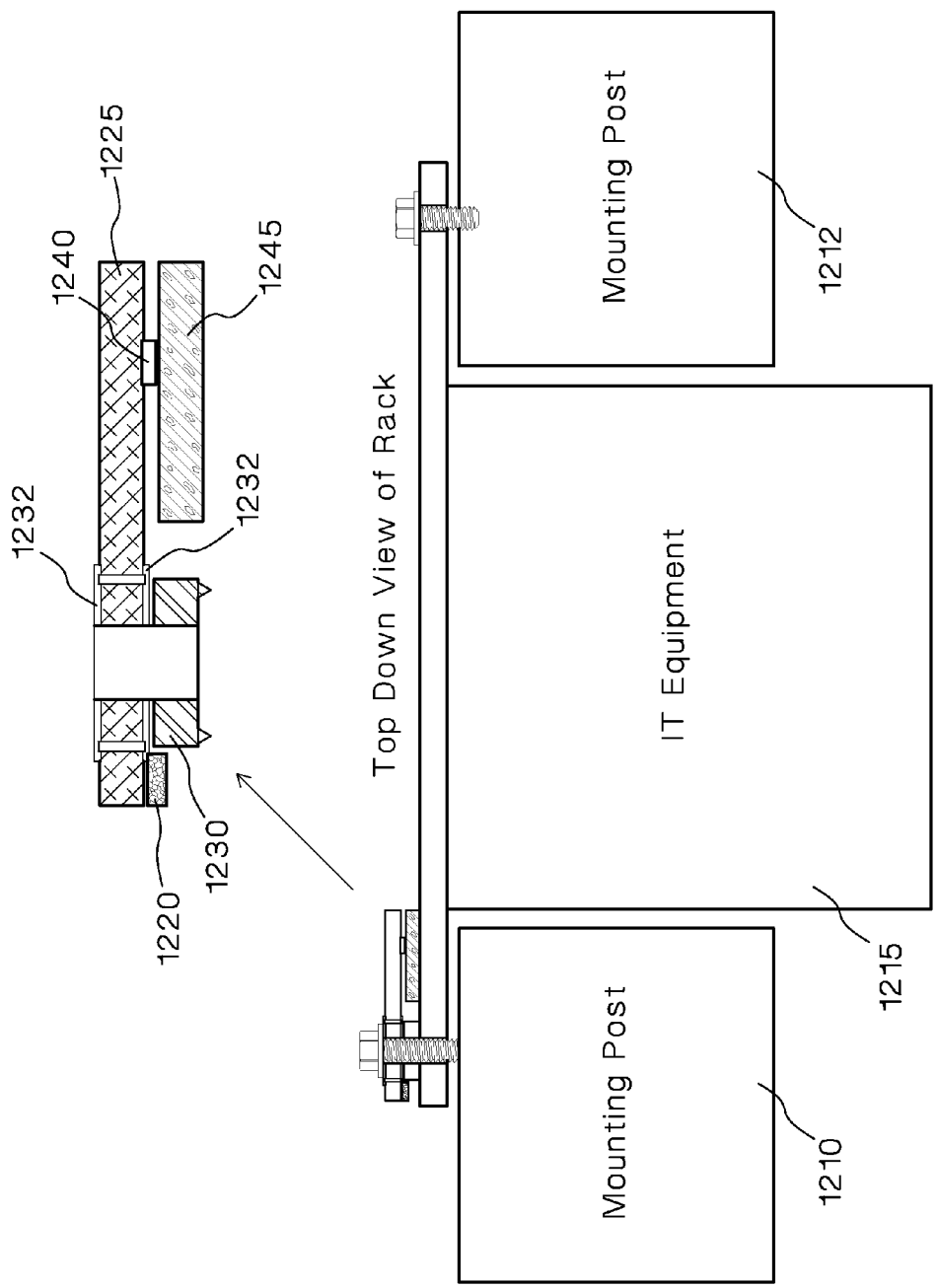
FIGS. 12a and 12b depict yet another illustrative embodiment of an IT equipment RFID tag that employs ferrite to enhance the received coupled power.
Figure 12B:
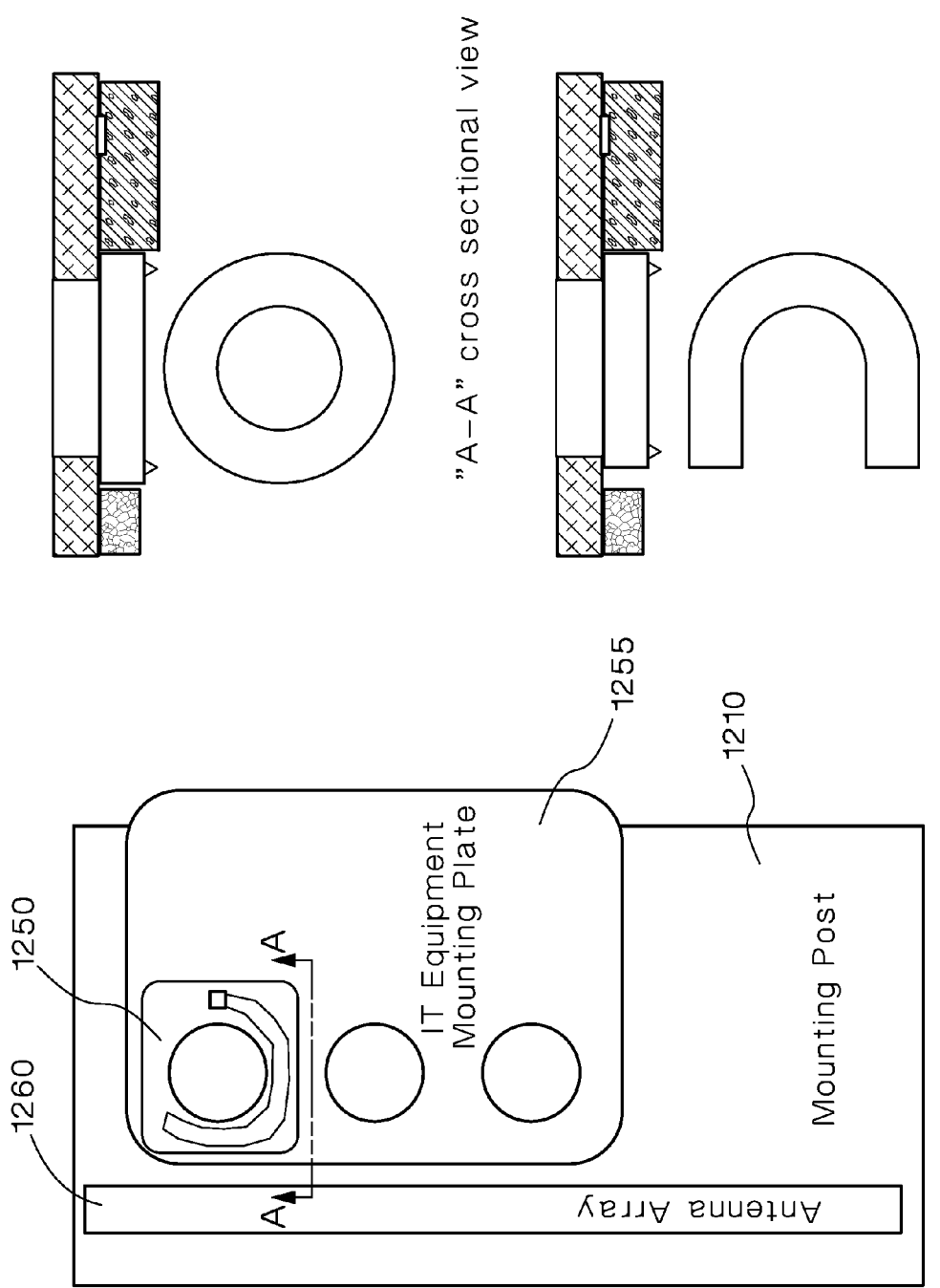

FIGS. 12a and 12b depict yet another illustrative embodiment an IT equipment RFID tag that employs ferrite to enhance the received coupled power. FIG. 12a depicts mounting posts 1210 and 1212 that support IT equipment 1215. A ferrite 1220 serves to enhance the received coupled power. The ferrite is held in place onto PCB 1225, which in this embodiment is a single-sided PCB, by adhesive (not shown) or a mechanical clip (not shown). A metallic washer 1230 is attached to the bottom of solder-coated PCB pad 1232 and functions in a manner analogous to that of the rivet assembly depicted in FIG. 10. Also in the embodiment of FIG. 12a, there is depicted a tag IC 1240 that is adjoined in this specific illustrative embodiment of the invention to a foam double sided tape 1245.

FIG. 12b depicts a RFID tag 1250 installed on mounting ear 1255 of the IT equipment. An antenna array 1260 also is mounted in mounting post 1210. This figure additionally depicts a cross-sectional view, and an alternative cross-sectional view taken along section A-A.

Figure 13:
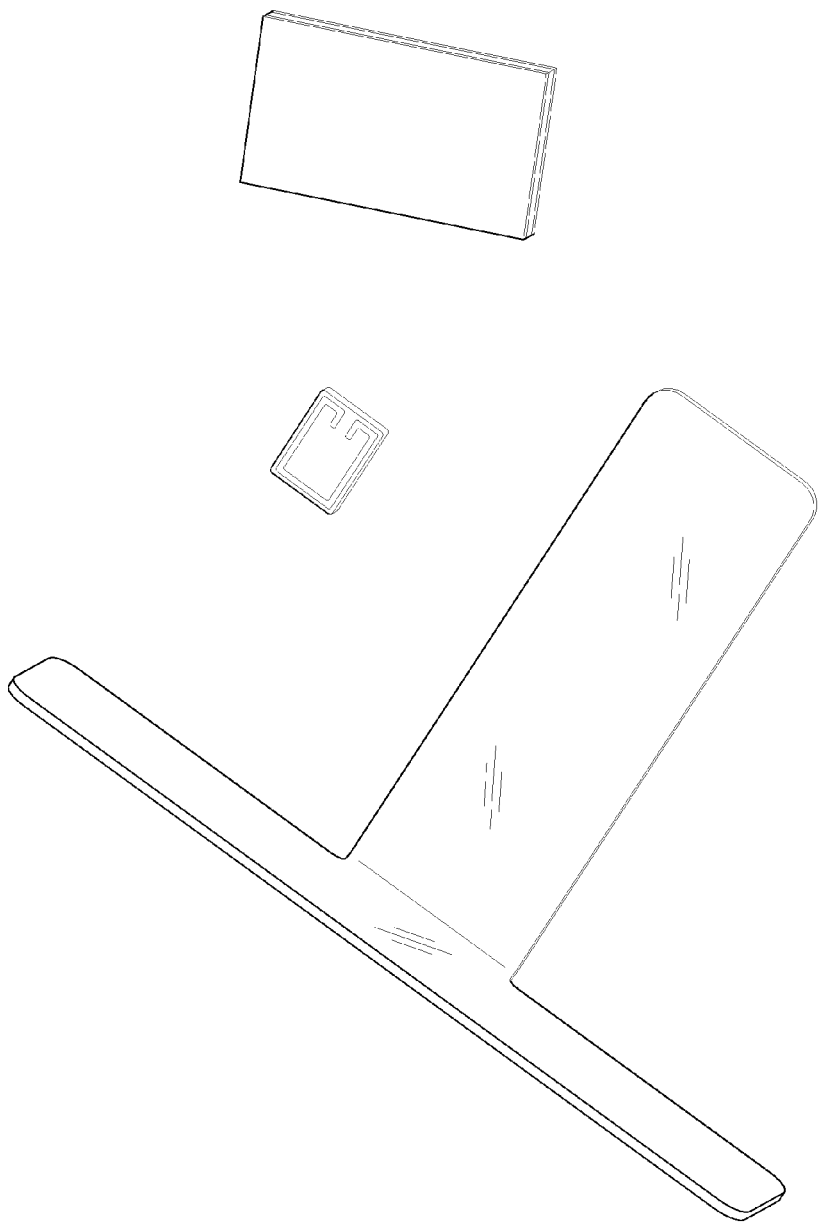
FIG. 13 shows the parts for a flexible RFID mounting system.
Figure 14:
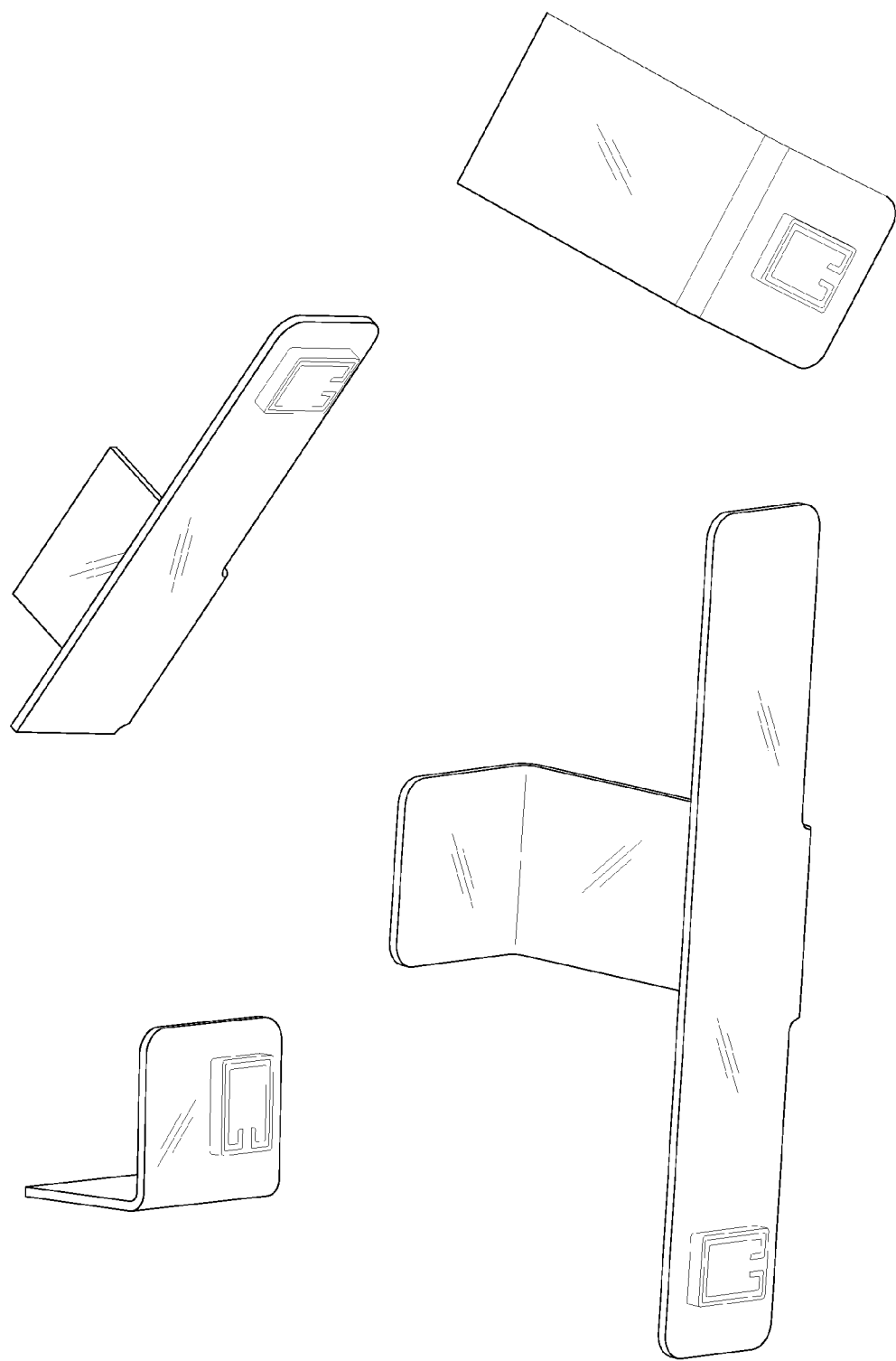
FIG. 14 shows the flexible mounts of FIG. 13 formed in various shapes.
Figure 15:
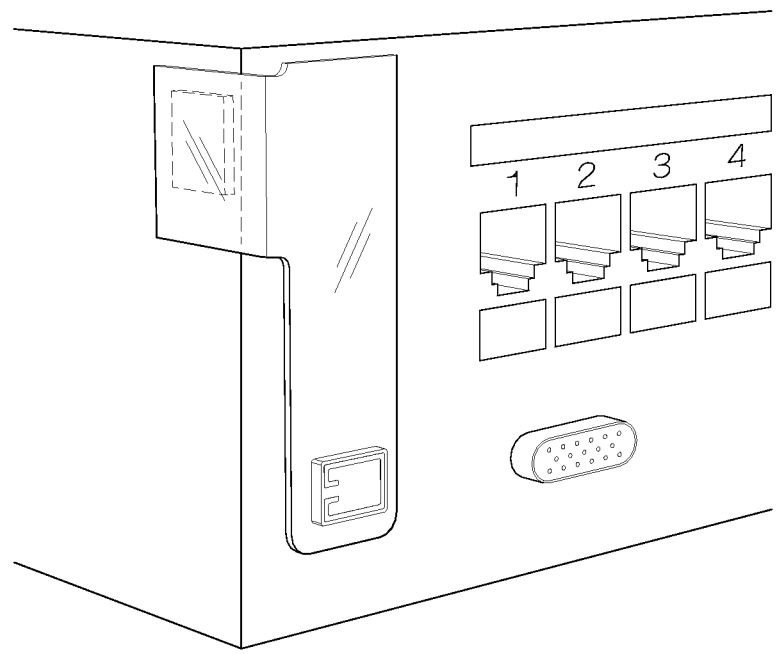
FIGS. 15-17 shows the flexible mounts of FIG. 13 attached to various pieces of IT equipment.
Figure 16:
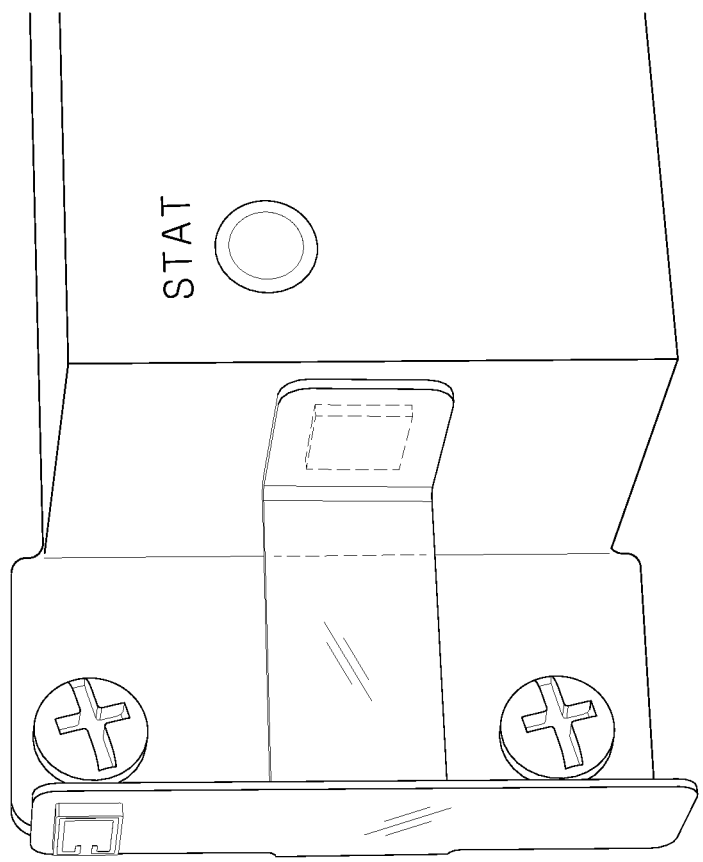
Figure 17:
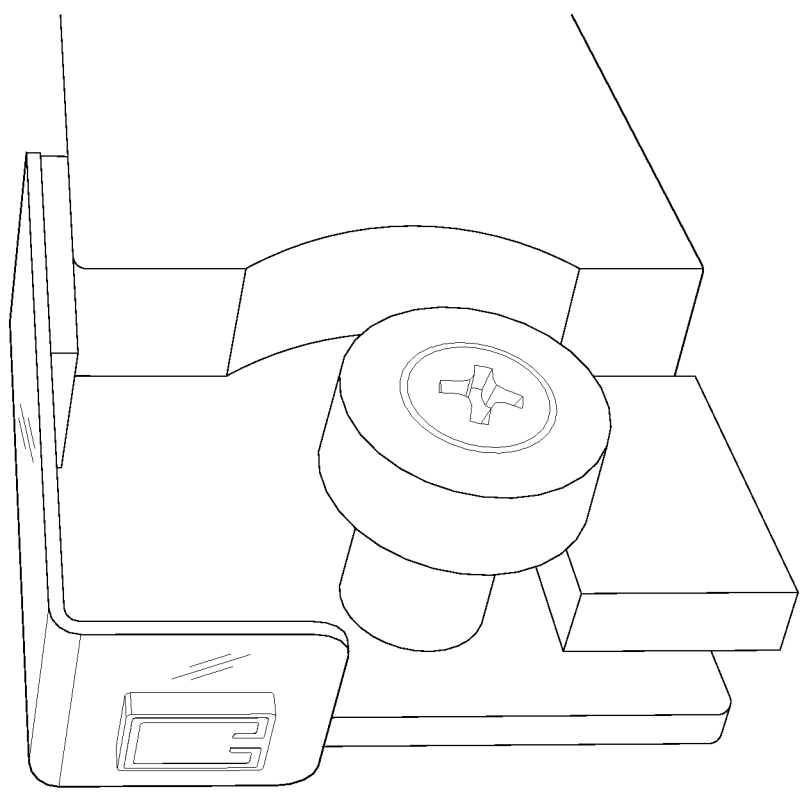

FIG. 13 shows the parts of one embodiment of a flexible mounting system 1300 for an RFID tag. The parts include formable polycarbonate mount 1301, double sided adhesive pad 1303, and RFID tag 1302. As shown in FIG. 14, formable polycarbonate mount 1301 can be bent and cut into a variety of shapes allowing the mounting of RFID tag 1302 to be customized in the field for each application. This customization aids in mounting the tag at a proper orientation and distance for coupling with the near field antenna of the antenna array. FIGS. 15-17 show flexible mounting system 1300 applied to various pieces of IT equipment 1500, 1600, 1700.

In one embodiment, as shown in FIG. 13, formable polycarbonate mount 1301 can be packaged partially preformed in the shape of a "T" with the top of the "T" bent perpendicular to the rest. This allows the mount to be installed in the field with fewer modifications for most installations.

Figure 18A:
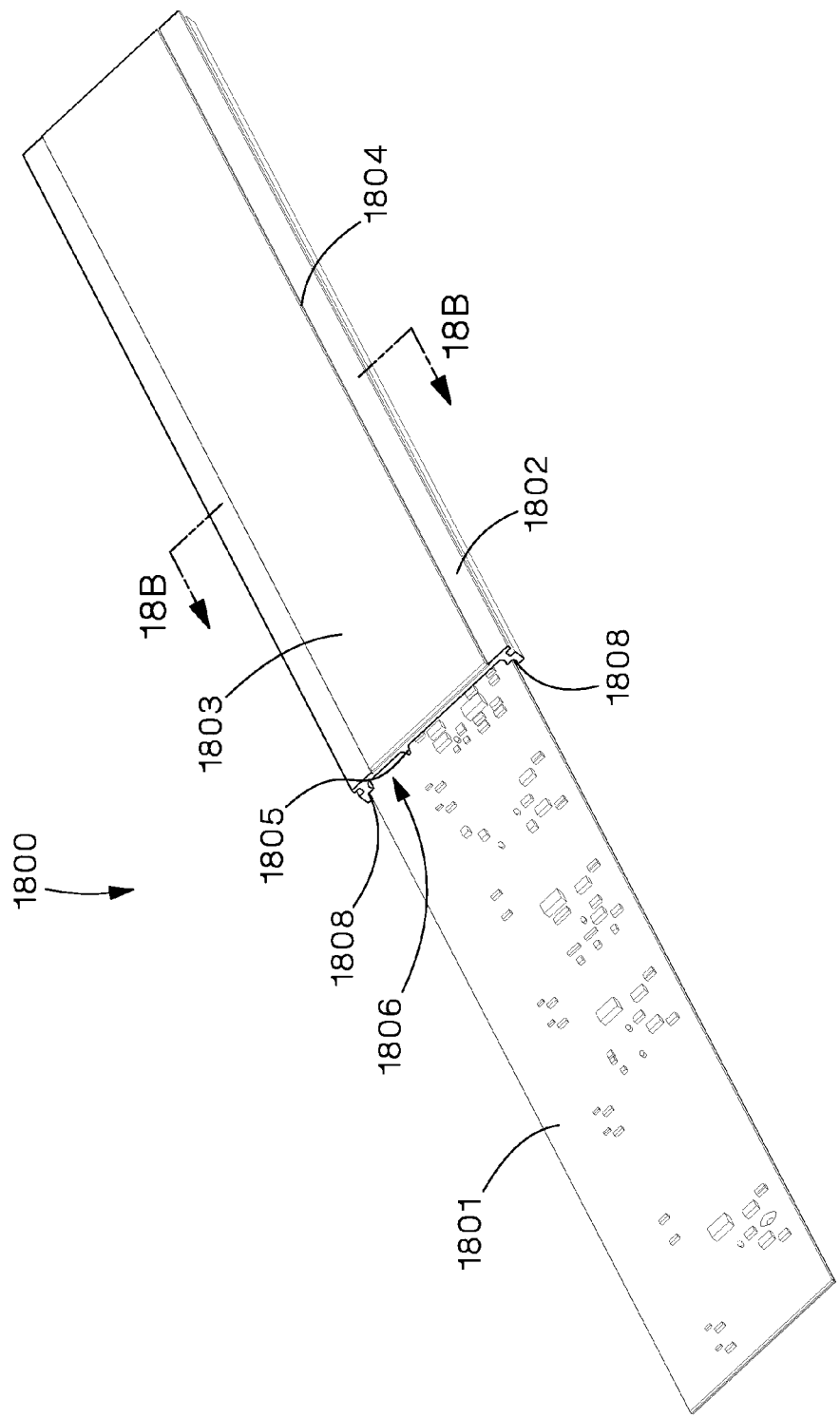
FIG. 18A shows a cut-away perspective view of one embodiment of an antenna array system.
Figure 18B:
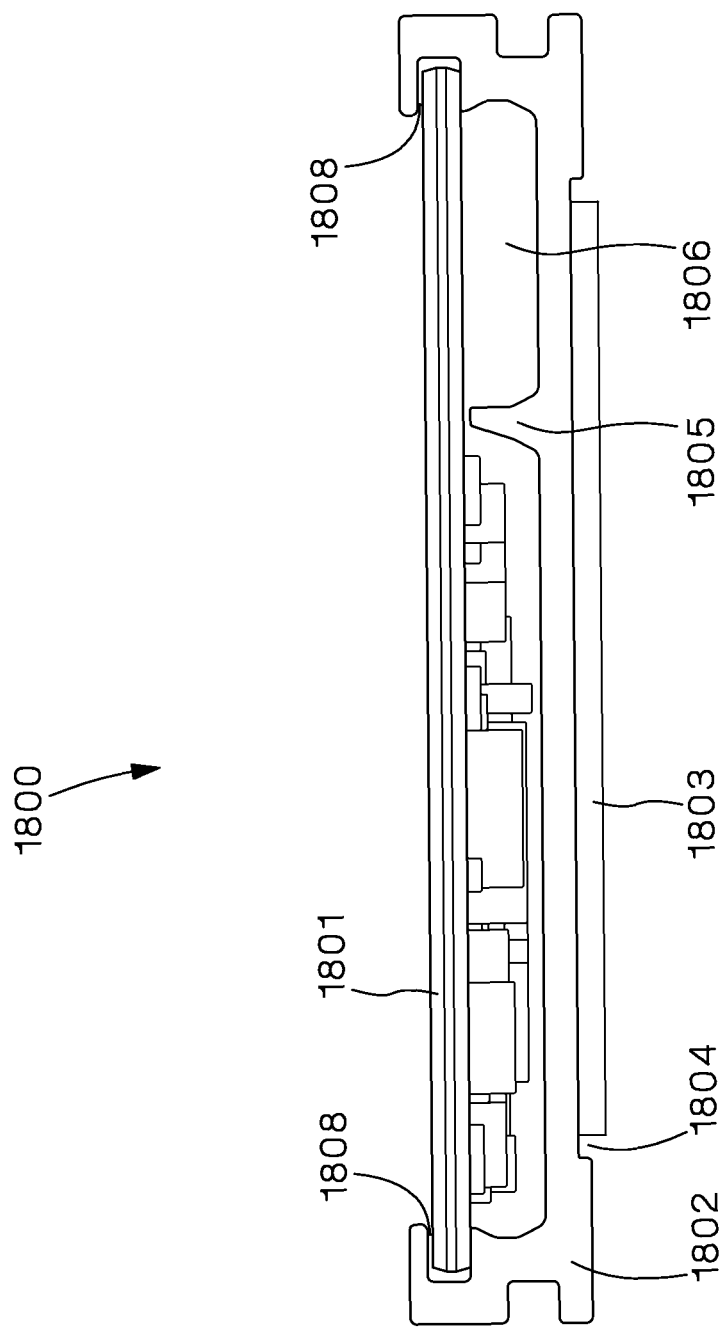
FIG. 18B shows a cross-sectional view of the antenna array system of FIG. 18A taken along line 18B-18B of FIG. 18A.

FIGS. 18A and 18B show one embodiment of an antenna array system that can be easily installed in many types of enclosures. Antenna array system 1800 is composed of antenna extrusion 1802, antenna printed circuit board (PCB) 1801, and magnetic strip 1803. Antenna extrusion 1802 has notches 1808 running its length for retaining antenna PCB 1801 and can be formed of aluminum. In one embodiment, Antenna extrusion 1802 can have ridge 1805 running down its length for forming channel 1806 which can be used to house cables and wires for connecting multiple PCB boards end to end. Antenna PCB 1801 contains circuitry and traces necessary for the antenna array. Magnetic strip 1803 can be secured to antenna extrusion 1802 opposite antenna PCB 1801. In one embodiment, magnetic strip 1803 can reside within recess 1804 on antenna extrusion 1802.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While various embodiments of the invention have been described, it will be apparent to those of ordinary skill in the art that other embodiments and implementations are possible within the scope of the invention. Accordingly, the invention is not to be restricted except in light of the attached claims and their equivalents.

The invention claimed is:

1. A system for tracking equipment that is installed on a rack, the system comprising:
   a near field RFID tag installed in a mounting portion of the equipment that is to be tracked via a flexible mounting system wherein the RFID tag is installed via a flexible polycarbonate sheet and further includes at least one ferrite element used to help shape a magnetic field;
   an antenna array installed on the rack in predetermined relation to the near field RFID tag for emitting a magnetic field, the antenna array also having at least one ferrite element used to shape a magnetic field, wherein the flexible polycarbonate sheet is sized and shaped in order to place the RFID tag at an optimum horizontal and vertical sensitivity distance based upon the size of the ferrite elements.

2. The system of claim 1 wherein the formable polycarbonate sheet is partially preformed in the shape of a "T" with the top of the "T" bent perpendicular with the rest of the polycarbonate sheet.

3. The system of claim 2 wherein the flexible mounting system also includes double-sided adhesive tape.

4. The system of claim 3 wherein the antennae array is mounted to a post in the rack.

5. The system of claim 1 wherein the at least one ferrite element of the RFID tag and the at least one ferrite element of the antenna array are sized and shaped in response to a distance between the RFID tag and the antenna array.

6. The system of claim 5 wherein the at least one ferrite element of the RFID tag and the at least one ferrite element of the antenna array are shaped and sized in response to a distance between equipment installed on the rack.

* * * * *